United States Patent [19]

Ashizawa et al.

[11] Patent Number: 4,664,063

[45] Date of Patent: May 12, 1987

[54] MOLECULAR BEAM EPITAXIAL GROWTH APPARATUS

[75] Inventors: Yasuo Ashizawa; Naoharu Sugiyama, both of Yokohama, Japan

[73] Assignee: Kabushiki Kaisha Toshiba, Kawasaki, Japan

[21] Appl. No.: 870,736

[22] Filed: Jun. 4, 1986

[30] Foreign Application Priority Data

Jun. 6, 1985 [JP] Japan .................... 60-123009

[51] Int. Cl.⁴ .................................... C23C 16/00
[52] U.S. Cl. .................... 118/724; 156/DIG. 103; 148/DIG. 169
[58] Field of Search ............. 118/724; 156/DIG. 103; 148/DIG. 169

[56] References Cited

U.S. PATENT DOCUMENTS

| | | | |
|---|---|---|---|
| 4,137,865 | 2/1979 | Cho | 118/724 |
| 4,201,152 | 5/1980 | Luscher | 118/500 |
| 4,542,712 | 9/1985 | Sato | 156/DIG. 103 |
| 4,580,522 | 4/1986 | Fujioka | 156/DIG. 103 |

OTHER PUBLICATIONS

*Molecular Beam Epitaxy of* III-V *Compounds;* K. Ploog, Springer-Verlag, 1980, pp. 80 and 109.
*J. Vac. Sci. Technol.*, 18(3), Apr. 1981, R. Z. Bachrach et al, "Morphological Defects Arising During MBE Growth of GaAs", pp. 756-764.

Primary Examiner—John D. Smith
Assistant Examiner—Vi D. Dang
Attorney, Agent, or Firm—Oblon, Fisher, Spivak, McClelland & Maier

[57] ABSTRACT

An apparatus for growing a compound semiconductor on a substrate by molecular beam epitaxy, includes a growth chamber, and Knudsen cells, disposed in the growth chamber, for generating molecular beams of source materials for the compound semiconductor independently. An ion gauge is disposed in the growth chamber, for measuring intensities of the molecular beams. A heater disposed in the growth chamber heats the substrate to a growth temperature of the compound semiconductor. A heating element heats the heater and the ion gauge to evaporate contamination materials including the source materials deposited on said substrate heating means and said measuring means after the growth of the compound semiconductor. An evacuater is provided to evacuate the growth chamber to a vacuum.

4 Claims, 3 Drawing Figures

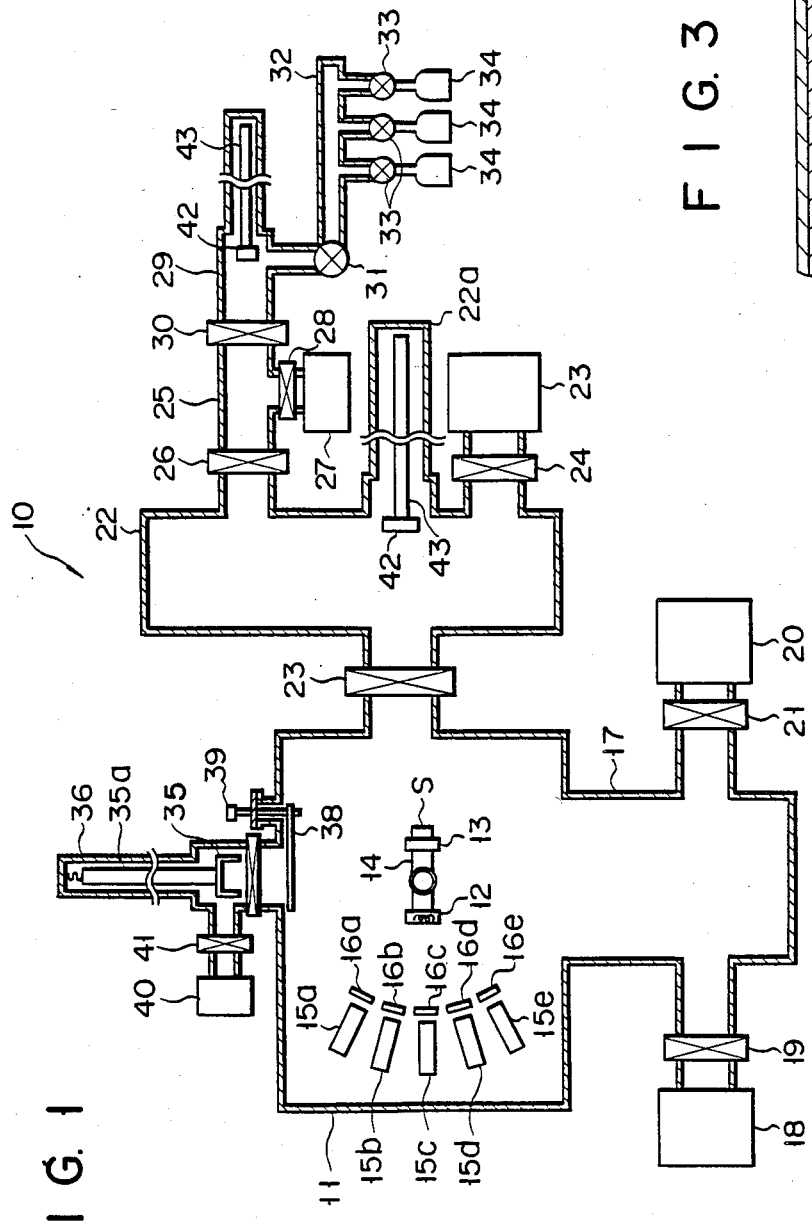
F I G. 1
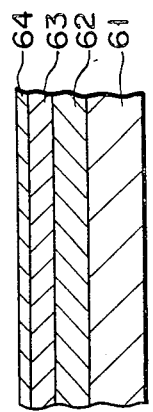
F I G. 3

MOLECULAR BEAM EPITAXIAL GROWTH APPARATUS

BACKGROUND OF THE INVENTION

1. Field of the Invention

The present invention relates to molecular beam epitaxial growth apparatus and method.

2. Description of the Prior Art

A molecular beam epitaxy (MBE) is suitable for growing a thin compound semiconductor film with high controllability. In this method, elements as constituents of the semiconductor film are used as source materials. For example, in order to grow doped aluminum gallium arsenide, aluminum, gallium, arsenic, and dopants are stored in Knudsen cells, respectively. These sources are heated to generate molecular beams independently. The Knudsen cells are arranged such that the central portion of their beam flux distribution intersects the substrate heated by a heating device. An ion gauge for measuring the respective molecular beam intensities is movably arranged inside the growth apparatus to control the intensities.

A molecular beam epitaxial growth apparatus is an ultra high vacuum apparatus. A frequency for opening the growth chamber to the air must be reduced to obtain a thin semiconductor film of a high purity and to obtain high efficiency of apparatus operation. In order to reduce contamination of the apparatus by impurities, apparatus maintenance operations such as parts replacement and cleaning must be minimized. However, if the apparatus is continuously used for a long period of time, source materials are undesirably deposited on the parts of the apparatus. In particular, an ion gauge and a substrate heating device tend to receive the influences of source material deposition.

The molecular beam intensities are measured prior to epitaxy. If the apparatus has been used for a long period of time, the source materials are deposited on the collector and grid of the ion gauge and the protective walls surrounding the ion gauge. The absolute sensitivity of the ion gauge is changed with time due to the deposited materials. If a source material having a high vapor pressure is deposited, it is evaporated again by radiation heat from the filament. The background vacuum pressure is neither increased sufficiently nor stabilized, resulting in measurement variations and noises. Therefore, the molecular beam intensities can not be accurately measured.

Source material deposition is also harmful for the substrate heating device. First, since an element of a high vapor pressure among the source materials is evaporated again by radiation heat from the heating device during epitaxial growth of a thin semiconductor film, the resultant film composition is changed. Second, in order to improve uniformity of the grown film, the heating device has a rotary mechanism which rotates about its axis. Source material deposition interferes with smooth rotation of the rotary mechanism and causes a dust source during rotation. When dust is attached to the substrate, it serves as an abnormal growth nucleus to degrade the quality of the grown film or adversely affect the subsequent semiconductor device fabrication process.

SUMMARY OF THE INVENTION

It is, therefore, an object of the present invention to provide a molecular beam epitaxial growth apparatus wherein a substrate heating device and an ion gauge can be cleaned without exposing a growth chamber to the outer atmosphere.

According to the present invention, there is provided an apparatus for growing a compound semiconductor on a substrate by molecular beam epitaxy, comprising:

a growth chamber;

means, disposed in the growth chamber, for generating molecular beams of source materials for the compound semiconductor independently;

means, disposed in the growth chamber, for measuring intensities of the molecular beams;

means, disposed in the growth chamber, for heating the substrate to a growth temperature of the compound semiconductor;

means for heating the substrate heating means and the measuring means and evaporating contamination materials including the source materials deposited on the substrate heating means and the measuring means after the growth of the compound semiconductor; and means for evacuating the growth chamber to a vacuum.

BRIEF DESCRIPTION OF THE DRAWINGS

FIG. 1 is a schematic sectional view of a molecular beam epitaxial growth apparatus according to an embodiment of the present invention;

FIG. 3 is a sectional view of a compound semiconductor multilayer structure formed by the growth apparatus in FIG. 1.

DESCRIPTION OF THE PREFERRED EMBODIMENT

Figure 2:
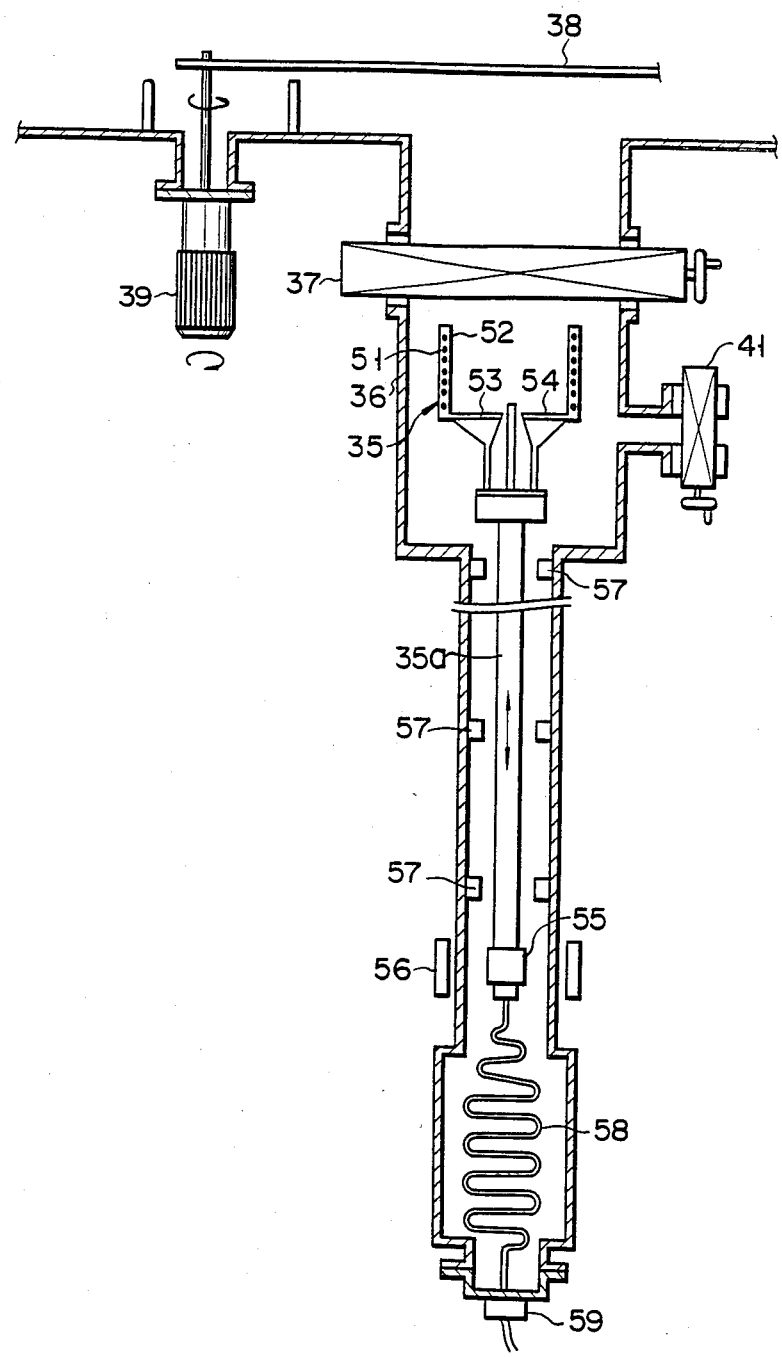
FIG. 2 is a detailed sectional view of a heating device used in the apparatus in FIG. 1.

The present invention will be described in detail with reference to the accompanying drawings. The same reference numerals throughout the drawings denote the same parts.

Molecular beam epitaxial growth apparatus 10 according to an embodiment of the present invention as shown in FIG. 1 includes growth chamber 11 to be maintained in a high vacuum. Molecular beam intensity measuring ion gauge 12 and substrate heating device 13 are arranged inside chamber 11. Ion gauge 12 is supported at two ends of rotatable support rod 14.

Knudsen cells 15 for storing elements constituting a compound semiconductor and dopants added to the compound semiconductor as needed are arranged inside chamber 11. Shutters 16 are disposed in front of cells 15, respectively. FIG. 1 shows five Knudsen cells 15a to 15e for storing gallium, aluminum, arsenic, silicon, and beryllium, respectively. Shutters 16a to 16e are arranged in front of cells 15a to 15e, respectively. Cells 15a to 15e are arranged such that the central portion of their beam flux distribution during epitaxial growth intersects substrate S heated by heating device 13.

Chamber 11 communicates with vacuum chamber 17 for maintaining chamber 11 at a high vacuum (preferably $10^{-9}$ to $10^{-10}$ Torr). Evacuating means is coupled to chamber 17. The evacuating means includes ion pump 18 coupled to chamber 17 through gate valve 19 and cryopump 20 through gate valve 21.

Pretreating chamber 22 communicates with growth chamber 11 through gate valve 23 at a position apart from vacuum chamber 17. Ion pump 23 is connected to pretreating chamber 22 through gate valve 24 to evacuate chamber 22 to a vacuum (preferably $10^{-8}$ to $10^{-9}$ Torr). As will be described below in detail, a semiconductor substrate is placed in chamber 22 and heated by a heating device (not shown), thereby exhausting gas adsorbed on the substrate. Further, accommodating chamber 22a for feed rod 43 communicates with growth chamber 22.

Preliminary vacuum chamber 25 communicates with pretreating chamber 22 through gate valve 26. Ion pump 27 is connected to chamber 25 through gate valve 28 to evacuate chamber 25 to a vacuum (preferably $10^{-6}$ to $10^{-7}$ Torr).

Semiconductor substrate feed chamber 29 communicates with chamber 25 through gate valve 30. A plurality of sorption pumps 34 (three in FIG. 1) are connected to common evacuating path 32 chamber 29 through corresponding valves 33 to evacuate chamber 29 to a vacuum of preferably $10^{-4}$ Torr. Paths 32 communicate with chamber 29 through valve 31.

Heating device 35 is supported by support rod 35a to clean ion gauge 12 and/or substrate heating device 13. Heating device 35 is accommodated in chamber 36 communicating with growth chamber 11 through gate valve 37. Shutter 38 is arranged to open/close chamber 36 and driven by drive mechanism 39. Ion pump 40 is connected to chamber 36 through gate valve 41.

Heating device 35 is best shown in FIG. 2. Heating device 35 has heater 51 between double cylindrical tantalum walls 52. The bottom portion of heating device 35 is covered by tantalum reflecting plate 53. Thermocouple 54 extends from plate 53 toward heating device 35. Magnet 55 is mounted on the outer surface of the rear end portion of support rod 35a. Magnet 56 surrounds the outer surface of chamber 36 at the position corresponding to that of magnet 55. Annular slide support guides 57 are mounted on the inner wall surface of chamber 36 to guide support rod 35a along the longitudinal direction thereof.

Wiring 58 for heater 51 and thermocouple 54 is connected to the rear end of support rod 35a and is led outside through current feedthrough 59.

Shutter 38 opens/closes chamber 36 upon rotation of drive mechanism 39. During epitaxial growth, chamber 36 is closed by shutter 38 to prevent deposition of the source materials on the sealed portion of gate valve 37.

A thin compound semiconductor (e.g., AlGaAs) film may be formed on a semiconductor substrate (e.g., GaAs) using the growth apparatus of this embodiment in the following manner.

A GaAs substrate is washed with a mixture of sulfuric acid, hydrogen peroxide and water. The substrate is dried and adhered by indium to molybdenum block 42 mounted on the distal end of feed rod 43. The substrate is thus fed in chamber 29. Chamber 29 is set at an atmospheric pressure or evacuated by sorption pumps 33 to a vacuum of down to $10^{-4}$ Torr. Gate valve 30 is opened to feed the GaAs substrate in preliminary vacuum chamber 25. Chamber 25 is evacuated by ion pump 27 to a vacuum of $10^{-6}$ to $10^{-7}$ Torr. Gate valve 26 is then opened to feed the substrate in pretreating chamber 22. Chamber 22 is evacuated by ion pump 23 to a vacuum of $10^{-8}$ to $10^{-9}$ Torr and, at the same time, the GaAs substrate is heated at 400° C. for 20 minutes, thereby eliminating gas adsorbed on the GaAs substrate. Gate valve 23 is then opened to mount GaAs substrate S on substrate heating device 13. Growth chamber 11 is evacuated by ion pump 18 and cryopump 20 to a vacuum of $10^{-8}$ to $10^{-10}$ Torr.

Shutters 16 are opened and the temperatures of Knudsen cells 15 are controlled so as to obtain predetermined molecular beam intensities while these intensities are being measured by ion gauge 12. When the respective molecular beam intensities reach predetermined values, rotary support rod 14 is rotated to face GaAs substrate S against Knudsen cells 15. GaAs substrate S is irradiated with an arsenic molecular beam and is heated by heating device 13 at a temperature of, e.g., 600° C. for 30 minutes. Then, growth of an AlGaAs film on GaAs substrate S is started.

In order to clean ion gauge 12 and heating device 13 after epitaxial growth, the following procedures are performed.

After substrate S is removed from growth chamber 11, ion gauge 12 is moved to a cleaning position (i.e., the position facing heating device 35). Shutter 38 and gate valve 37 are opened, and by operation of magnets 55 and 56 heating device 35 is introduced in growth chamber 11. Ion gauge 12 is inserted in heating device 35. Heater 51 is operated to gradually increase the temperature. The temperature is maintained at a temperature of 700° to 750° C. exceeding the AlGaAs growth temperature (600° C.). Heating is maintained until growth chamber 11 is evacuated by ion pump 18 and cryopump 20 to a pressure of $10^{-8}$ Torr or less (for about 20 to 30 minutes). Meanwhile, the source materials deposited on ion gauge 12 are evaporated and exhausted, and ion gauge 12 is thus cleaned. After cleaning, the heater is reset in the reverse procedures. Substrate heating device 13 can also be cleaned in the same manner as described above. Ion gauge 12 is cleaned preferably at a temperature of 400° to 500° C., and substrate heating device 13 is cleaned preferably at a temperature of 700° to 750° C.

Ion gauge 12 and substrate heating device 13 are preferably cleaned after every 3 to 5 growth cycles of thin compound semiconductor film formation. The cleaning is most preferably performed after each film formation cycle.

The main source material attached to and deposited on the parts of the growth chamber during AlGaAs growth is almost always arsenic. Gallium and aluminum are not substantially deposited on the parts. Even if they are deposited, they cannot be a contamination source because of their low vapor pressures.

According to the present invention, by repeating growth of a thin compound semiconductor film and cleaning after epitaxial growth, a compound semiconductor multilayer structure including at least one layer of a compound semiconductor containing three elements (e.g., AlGaAs) can be formed on a semiconductor substrate (e.g., a GaAs substrate). FIG. 3 shows a multilayer structure formed by the apparatus described above. Referring to FIG. 3, 1μ-m thick nondoped GaAs layer 62 is formed on GaAs substrate 61. 200-nm thick silicon-doped $Al_{0.3}Ga_{0.7}As$ layer 63 is formed on layer 62. 20-nm nondoped GaAs layer 64 is formed on layer 63.

The properties of the thin semiconductor films grown by the growth apparatus of the present invention are compared with those of films grown without cleaning, as follows.

EXAMPLE 1

Growth of one GaAs film having a thickness of 1-2 μm on a GaAs substrate using the growth apparatus in FIG. 1 was repeated 20 times. The ion gauge and the substrate heating device were cleaned in the procedures described above for each film growth cycle.

As a Comparative Example, the above cycle was repeated 10 times without cleaning.

The number of thin GaAs film surface defects each having a size of 2 μm or more was measured by an optical microscope and a surface defect density of each sample was calculated. The average values are summarized in Table 1.

TABLE 1

|  | No. of Samples | Surface Defect Density |
|---|---|---|
| Example 1 | 20 | 400 defects/cm$^2$ |
| Comparative Example | 10 | 900 defects/cm$^2$ |

As is apparent from Table 1, the thin compound semiconductor films grown with cleaning according to the present invention have better properties than those of films grown without cleaning.

EXAMPLE 2

In order to examine reproducibility of composition ratio x in formation of $Al_xGa_{1-x}As$ on a GaAs substrate, 1-μm thick compound semiconductor films were each grown with identical molecular beam intensities, and values x of the resultant thin films were measured by 4.2 K photoluminescence measurement. The results of the thin films with cleaning according to the above-described procedures and without are summarized in Table 2 below.

TABLE 2

| Design Value x | Measured Value | | | | | |
|---|---|---|---|---|---|---|
|  | Without Cleaning | | | With Cleaning | | |
|  | No. of Samples | $\bar{x}$ | $\sigma x$ | No. of Samples | $\bar{x}$ | $\sigma x$ |
| 0.3 | 8 | 0.305 | 0.015 | 7 | 0.302 | 0.005 |
| 0.5 | 6 | 0.510 | 0.02 | 7 | 0.503 | 0.01 |

As is apparent from Table 2, ion gauge reading precision for molecular beam intensities according to the films with cleaning and hence mixed crystal ratio controllability can be improved.

As described above, when the molecular beam epitaxial growth apparatus according to the present invention is used, the ion gauge and the substrate heating device can be cleaned without exposing the growth chamber to the atmosphere. Therefore, the quality of the resultant compound semiconductor can be improved.

What is claimed is:

1. An apparatus for growing a compound semiconductor on a substrate by molecular beam epitaxy, comprising:
    a growth chamber;
    means, disposed in said growth chamber, for generating molecular beams of source materials for the compound semiconductor independently;
    means, disposed in said growth chamber, for measuring intensities of the molecular beams;
    means, disposed in said growth chamber, for heating the substrate to a growth temperature of the compound semiconductor;
    heating means for heating said substrate heating means and said measuring means and for evaporating contamination materials including the source materials deposited on said substrate heating means and said measuring means after the growth of the compound semiconductor, said heating means being adapted to move into or to be removed from said growth chamber and having a shape for accommodating said substrate heating means and said measuring means; and
    means for evacuating said growth chamber to a vacuum.

2. The apparatus according to claim 1, wherein said heater is arranged between double cylindrical reflecting walls.

3. The apparatus according to claim 1, wherein said substrate heating means and said measuring means are mounted on both ends of a rotatable support rod.

4. The apparatus according to claim 1, wherein said evacuating means comprises a cryopump and an ion pump.

* * * * *